US005592644A

United States Patent [19]
Thomas

[11] Patent Number: 5,592,644
[45] Date of Patent: *Jan. 7, 1997

[54] FERROELECTRIC STORAGE DEVICE EMULATING A ROTATING DISK DRIVE UNIT IN A COMPUTER SYSTEM AND HAVING AN OPTICAL DATA INTERFACE

[75] Inventor: Michael E. Thomas, San Jose, Calif.

[73] Assignee: Framdrive, Greenbrae, Calif.

[ * ] Notice: The term of this patent shall not extend beyond the expiration date of Pat. No. 5,359,726.

[21] Appl. No.: 326,660

[22] Filed: Oct. 19, 1994

Related U.S. Application Data

[63] Continuation-in-part of Ser. No. 895,328, Jun. 8, 1992, Pat. No. 5,359,726, which is a continuation-in-part of Ser. No. 374,822, Jul. 3, 1989, abandoned, which is a continuation-in-part of Ser. No. 288,160, Dec. 22, 1988, abandoned.

[51] Int. Cl.$^6$ .............................. G06F 3/00; G06F 13/00; G11C 11/22
[52] U.S. Cl. .......................... 395/431; 395/442; 395/500; 395/309; 365/145
[58] Field of Search ...................................... 395/431, 442, 395/421.01, 500, 892, 894, 882, 883, 884, 285, 286, 309; 365/145

[56] References Cited

U.S. PATENT DOCUMENTS

| | | | |
|---|---|---|---|
| 3,866,187 | 2/1975 | Dougherty et al. | 365/125 |
| 4,280,219 | 7/1981 | Lowenschuss et al. | 365/129 |
| 4,295,205 | 10/1981 | Kunstadt | 395/410 |
| 4,456,971 | 6/1984 | Fukuda et al. | 395/500 |
| 4,467,421 | 8/1984 | White | 395/445 |
| 4,710,789 | 12/1987 | Furutani et al. | 365/149 |
| 4,727,512 | 2/1988 | Birkner et al. | 395/500 |
| 4,896,262 | 1/1990 | Wayama et al. | 395/500 |
| 4,958,315 | 9/1990 | Balch | 395/500 |

OTHER PUBLICATIONS

Ramtron Corporation (Colorado Springs, Colorado) Article Reprints and Technical Reports on Ferroelectric Devices, 1989.

International Memories Inc. (Cupertino, Calif.) OEM Reference and Maintenance Manual 5.25 Inch Winchester Disk Drive, Models 5006H, 5012H, 5018H.

Horton et al, "Nonvolatile FRAMs Fit Standard Memory Applications," Electronic Products, Jun. 1, 1988, pp. 41–46.

Weber, "A New Memory Technology Is About To Hit The Market," Electronics, Feb. 18, 1988, pp. 91–94.

*Primary Examiner*—Glenn Gossage
*Attorney, Agent, or Firm*—Michael A. Glenn

[57] ABSTRACT

A method and apparatus are disclosed for emulating a rotating disk drive using a removable ferroelectric solid state storage device having an optical data interface in a microprocessor controlled storage system. The removable ferroelectric solid state storage device has non-volatile memory integrated circuit components in a ferroelectric random access memory (FRAM) pack. The ferroelectric memory pack utilizes the same read/write recording techniques as those for transferring data between a host computer and a rotating disk drive. The optical read and write data pass through a write data input buffer to a fiber optic light receiver, and a read data output buffer to a fiber optic light transmitter, and are thereby sent out on an ST506/SASI/ESDI/SCSI bus to a RAM memory pack controller.

15 Claims, 14 Drawing Sheets

FERROELECTRIC STORAGE DEVICE EMULATING A ROTATING DISK DRIVE UNIT IN A COMPUTER SYSTEM AND HAVING AN OPTICAL DATA INTERFACE

This is a continuation-in-part of U.S. patent application Ser. No. 07/895,328, filed Jun. 8, 1992, now U.S. Pat. No. 5,359,726, which is a continuation-in-part of U.S. patent application Ser. No. 07/374,822, filed Jul. 3, 1989, now abandoned, which is a continuation-in-part of U.S. patent application Ser. No. 07/288,160, filed Dec. 22, 1988, now abandoned.

BACKGROUND OF THE INVENTION

1. Technical Field

The invention relates to data storage devices. More particularly, the invention relates to solid state data storage devices.

2. Description of the Prior Art

Floppy disk drives have slow access, low storage, and primitive data transfer rates, with no capability for fast data interaction on today's 16 and 32 bit computer systems.

For many years, the 5.25 inch floppy disk drive has been a dinosaur in the high technology, fast-moving data processing field.

5.25" Winchester disk drives have been heralded as the only new high capacity, high data transfer rate input/output (I/O) device for the personal computer. It took years even with high technology, for aggressive companies to optimize and miniaturize the components necessary for Winchester disk drives for low cost, small size, and high capacity requirements. Large bobbin servo linear positioning motors weighing 50 lbs. with dimensions of 12 inches by 8 inches have been replaced by the present 3 inch by 1.5 inch units weighing 0.5 lb. Stepper motors having 2 phases with 18 degree increments have given way to the present 5 phase motors with 0.72 degree step increments with micro-step, ramp-up, and ramp-down capabilities. Thus, present Winchester disk drives allow a microcomputer to control the absolute position of the read/write (R/W) heads in a manner similar to the closed loop servo actuated systems.

Past spindle drive systems utilized large cumbersome motors using belt-driven spindles. The insurgence of numerous drive manufacturers to miniaturize this large cumbersome device eventually brought about the creation of a "pancake style" spindle motor which uses multi-layered printed circuit board technology.

A present pancake style motor with a thickness of 0.25 inches can now generate the torque needed to spin the plated media used for the storage in a Winchester drive.

The I/O controllers for the hard disk drives of yesterday were customized boards 48 inches by 48 inches with data transfer rates of 500 kbits/sec. These complex, bulky boards required extensive interconnection cabling and sensitive boot software to set-up on-board logic to perform the required data interaction between the host system and the hard disk drive. There are now many standard Winchester controllers of small size incorporating various advanced data retrieval systems. Modern devices typically have dimensions of 5.25 inches by 6 inches and are easily adaptable to many of the personal computers on the market with the added feature of a data transfer rate in excess of 5 Mbits/sec. Software was created to run the high tech drives that interface to the 16/32 bit micro-systems, and many thousands of hours were spent across the nation to accomplish this task.

The media and heads are the key and essential ingredients for the continued success of the 5.25 inch Winchester market. Equipment previously used for making integrated circuits began being used for making cobalt-coated 600 oersted 0.75 inch aluminum substrates for the demanding appetite of the 5.25 inch Winchester market. Unfortunately, this type of media is very expensive to produce. It has high material costs and low yields, and requires expensive manufacturing equipment. Further, the R/W heads are even more difficult to produce in adequate volumes and low costs.

2.00/3.50 inch floppy disk cartridge drives were next to appear on the market. With its small size, plastic molded parts, and a metal hub ring that allows the medium to be rotated at a 360/600 rpm speed, this cartridge had the effect of taking the flexible tape diskette from a primarily back-up storage device of slow speed to a medium capacity data storage device with slow data transfer rates. Thus, the 2.00 inch/3.50 inch floppy disk cartridge has solved none of today's needs for a small size storage tape backup device for the 5.25 inch Winchester disk drive (with storage capabilities now approaching 600 Million bytes in a 5.25 inch package).

In the art at the time of the writing of this application, a wide trade-off exists. A fixed media such as a Winchester disk has a very high storage capacity and relatively high access speed. However, in using a Winchester disk, if there is a problem with the storage media (the disk itself) it must be professionally replaced. Moreover, since the storage capacity is unexpandable, the total storage capacity of a fixed drive system such as a Winchester disk is equal to the amount of total storage on the single Winchester drive itself.

In contrast, solid state ferroelectric integrated circuit non-volatile memory, herein referred to as ferroelectric Random Access Memory or "FRAM" memory, has a relatively small storage capacity, no special requirements and no access time. "FRAM" is a registered trademark of RAMTRON Corporation of Colorado Springs, Colo.

Moreover, removable ferroelectric non-volatile memory packs —a pack having-multilayers of the same type board and a board consisting of many FRAM units on a single printed circuit board—may be interchanged, thus allowing the user to compile a library of packs. By buying a single drive and a plurality of packs, the user can thereby obtain many times the storage amount as found on a single Winchester drive by accumulating many removable solid state memory FRAM packs.

Prior art techniques for replacing rotating memory systems with solid state memory have been used for purposes other than using non-volatile solid state memory utilizing recording techniques for transferring data to rotating memory storage. For example, U.S. Pat. No. 4,298,956, granted May 14, 1979 discloses a digital read recovery with variable frequency using read only memory (ROM) integrated circuits. Another example is, U.S. Pat. No. 3,573,762, granted Apr. 6, 1971 which discloses a non-volatile storage device used to replace disk drives using volatile READ/WRITE storage devices and non-volatile memory for control functions.

A trade off in designing disks also occurs. In a hard disk, the read/write head typically does not touch the disk, but rather "flies" over the surface of the disk, as close as possible to it. The condition of the head touching the disk is referred to as a head "crash" and causes catastrophic loss of the data encoded thereupon. Typically, as the height of the head over the disk decreases, the storage capacity and access speed can increase. However, once a certain small height occurs, the smoothness of the surface of the disk attains critical importance.

In contrast with the existing drive technology, the foundation of yesterday's memory used in the first computers were iron core memories. Core memories were long forgotten as slow, large, expensive, and power hungry memory devices. A major breakthrough was made that allows one to take advantage of the first core memories' non-volatile characteristics and also reduce their size a million fold.

Even though the theory of ferroelectrics was discovered in 1921, few attempts have been made to use this technology, and the first integrated circuits of small memory storage are just beginning to appear. Ferroelectric materials exhibit the same general characteristics of superconductor materials now in development.

Ferroelectric materials with non-volatile Q-V hysteresis loop characteristics similar to B-H loops in Iron magnetics will take the place of the rotating memory disk. There have been many prior art attempts to maximize the access rate and storage capacity of a disk. Typically, these involve improvements to the heads, controller circuitry and disk composition. It is an object of the present invention to provide improvements in all of the above-mentioned areas, and to produce a system that out-performs the state of the art as it now exists by a very large amount.

SUMMARY OF THE INVENTION

A removable ferroelectric non-volatile memory drive takes advantage of high capacity Winchester drive controller technology and controller software already established over the past years to modernize the Winchester drive. FRAM memory boards with several boards stacked together allow much higher amounts of data storage and 100 times the rate of present day data transfer operations. No moving parts will allow an unlimited number of FRAM drives to be parallel I/O bused together during read and write operations. Solid state integrated non-volatile memory will be able to operate in much wider temperature and altitude ranges improving reliability. Head settle and access times for the FRAM drive are near ZERO since there are no moving parts.

Ferroelectric non-volatile memory integrated circuit devices are being produced in small amounts now with larger devices available the fourth quarter of 1994. It is very practical and cost effective to develop a FRAM pack Winchester drive that uses the fixed disk Winchester technology. By using a FRAM memory drive design, high capacity (40 megabytes and up) and much higher data transfer rates (25 megabit/sec and up) can be realized. The FRAM pack drive fits into a niche already created for such a product. The drive is completely hardware and software interchangeable with today's ST506/512, SASI (Shugart Associates Standard Interface), ESDI (Enhanced Small Disk Interface) and SCSI (Small Computer Systems Interface) I/O Winchester drive controller electronics and software. Drives and memory in accordance with the present invention will be produced inexpensively when large memory devices become available in late 1994.

BRIEF DESCRIPTION OF THE DRAWINGS

The accompanying drawings, which are incorporated in and form a part of the disclosure, illustrate an embodiment of the invention and, together with the description, serve to explain the principles of the invention. In the drawings.

DETAILED DESCRIPTION OF THE PREFERRED EMBODIMENT

Figure 1:
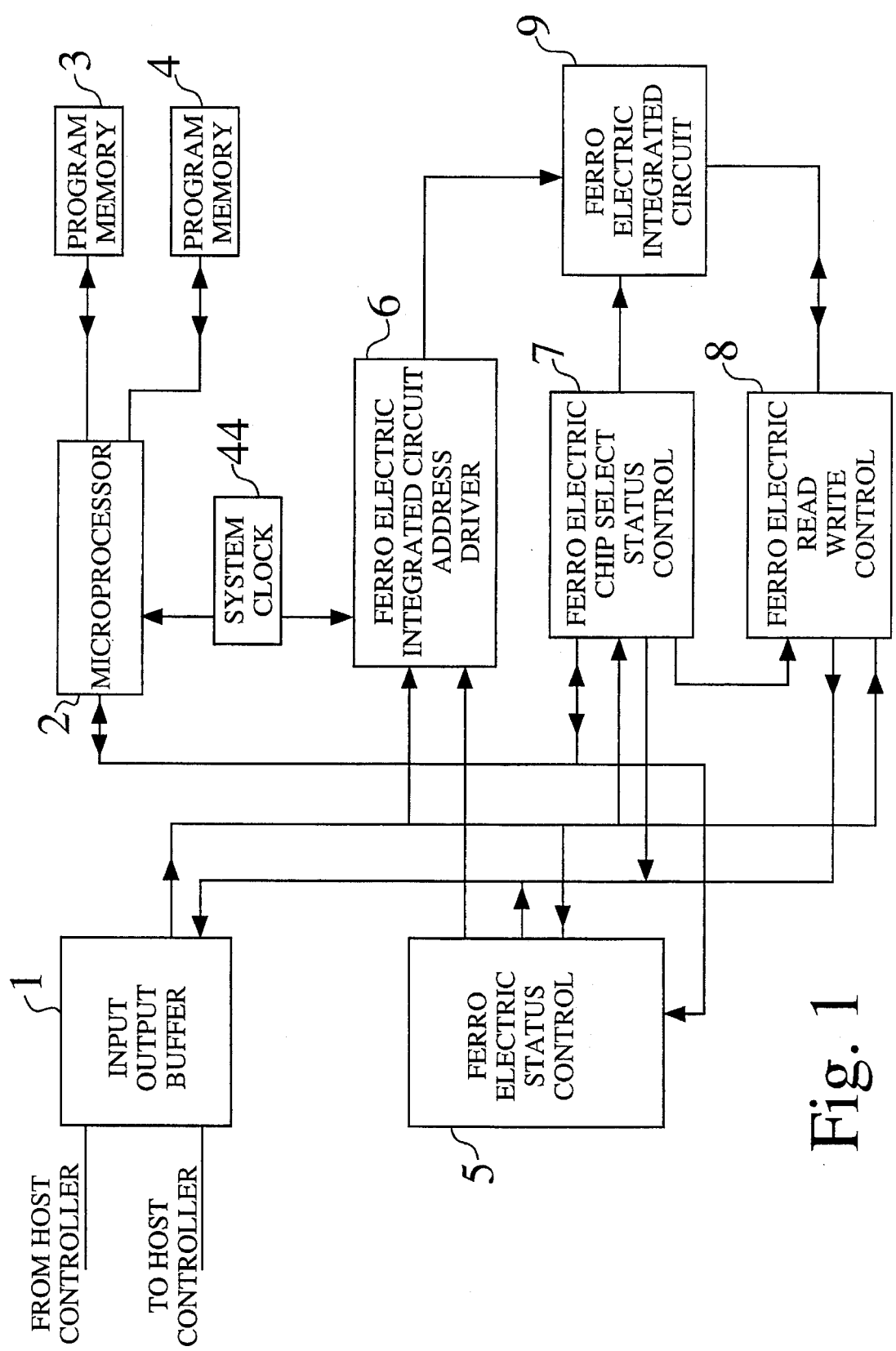
FIG. 1 is an overall block diagram of an exemplary Removable FRAM Pack Ferroelectric Drive in accordance with the present invention.
Figure 2:
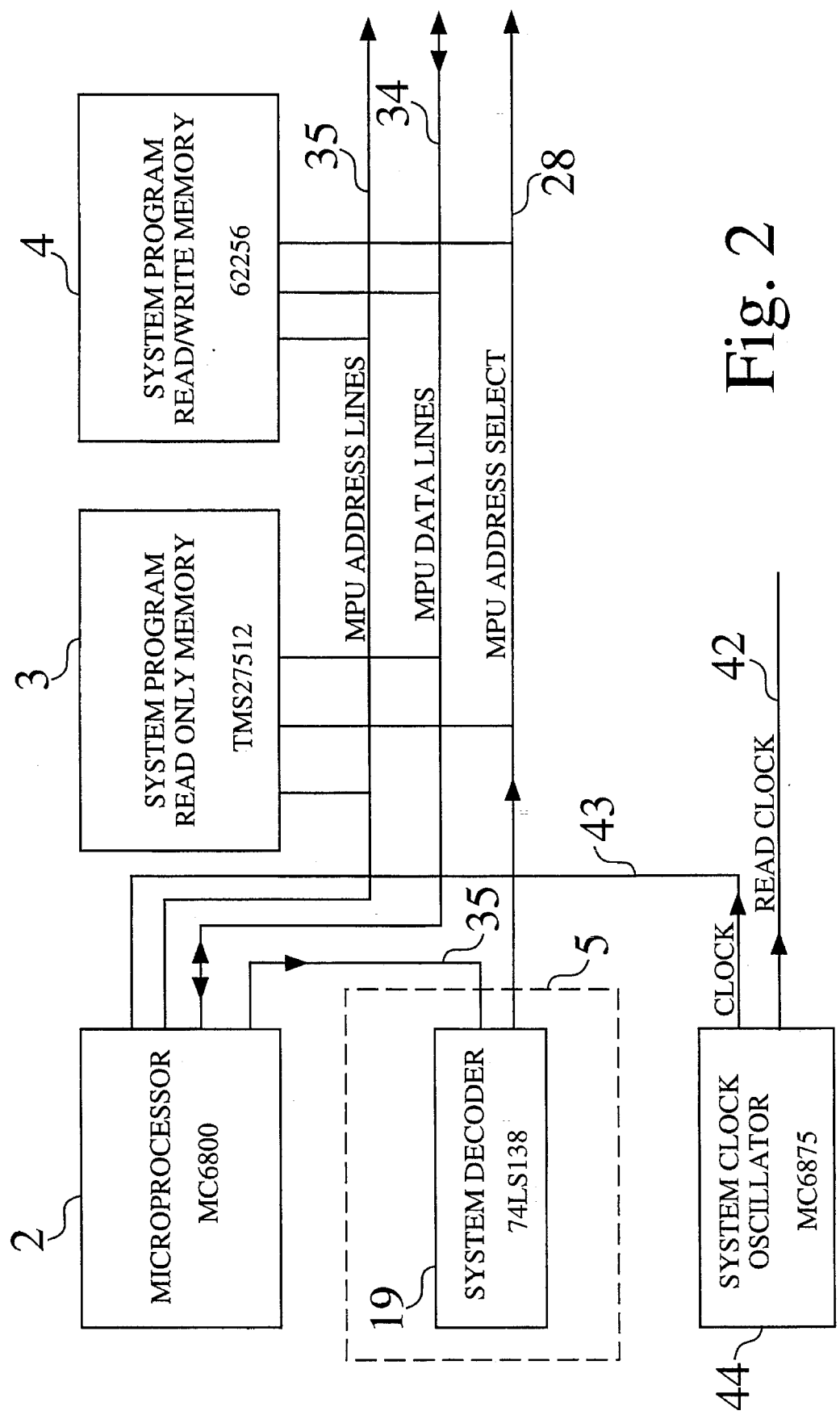
FIG. 2 is a schematic diagram of the Microprocessor Drive circuit shown in FIG. 1.
Figure 3:
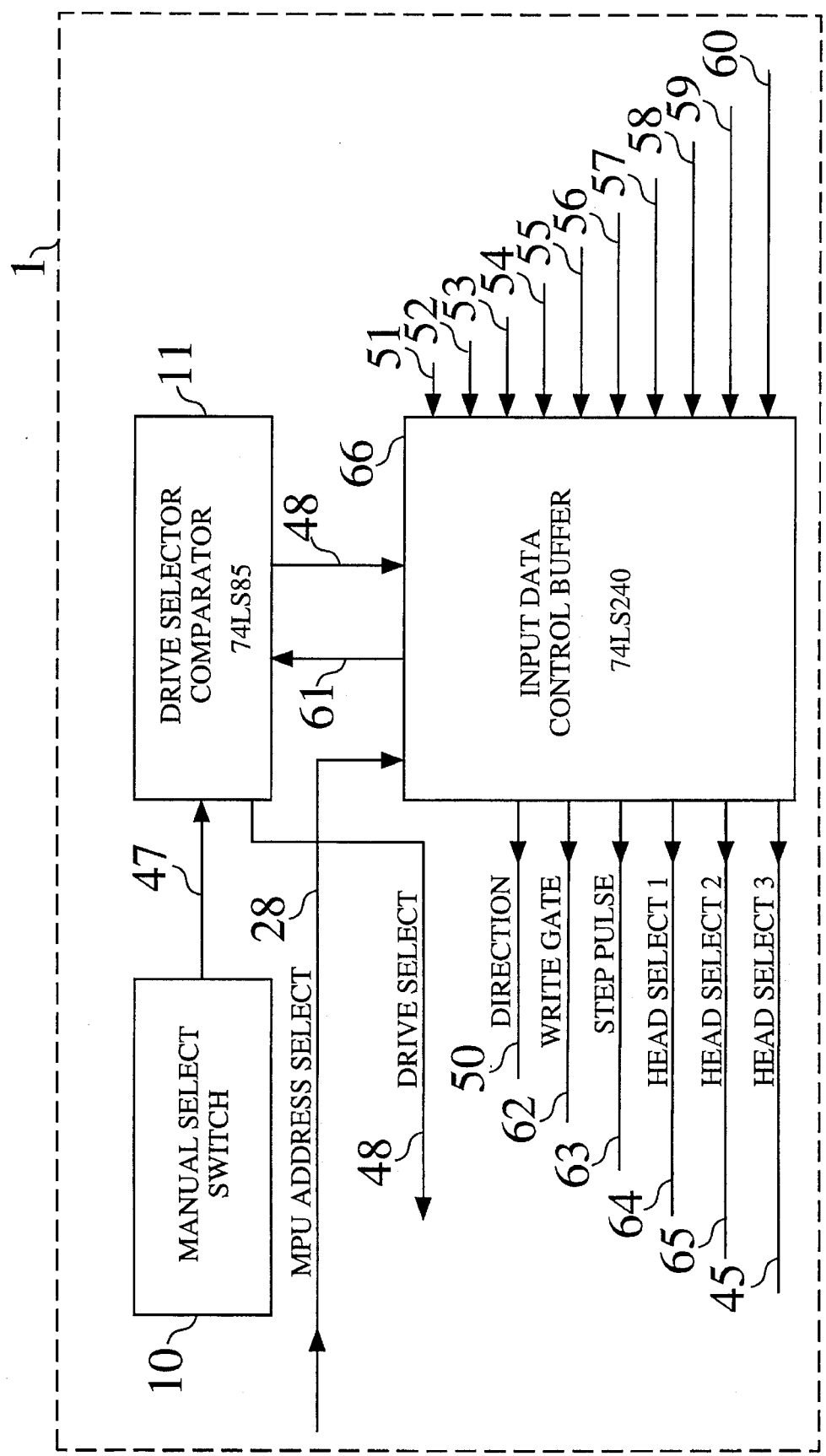
FIG. 3 is a schematic diagram of the Input Data Control Buffer circuit shown in the Input Output buffer Block Diagram in FIG. 1.
Figure 4:
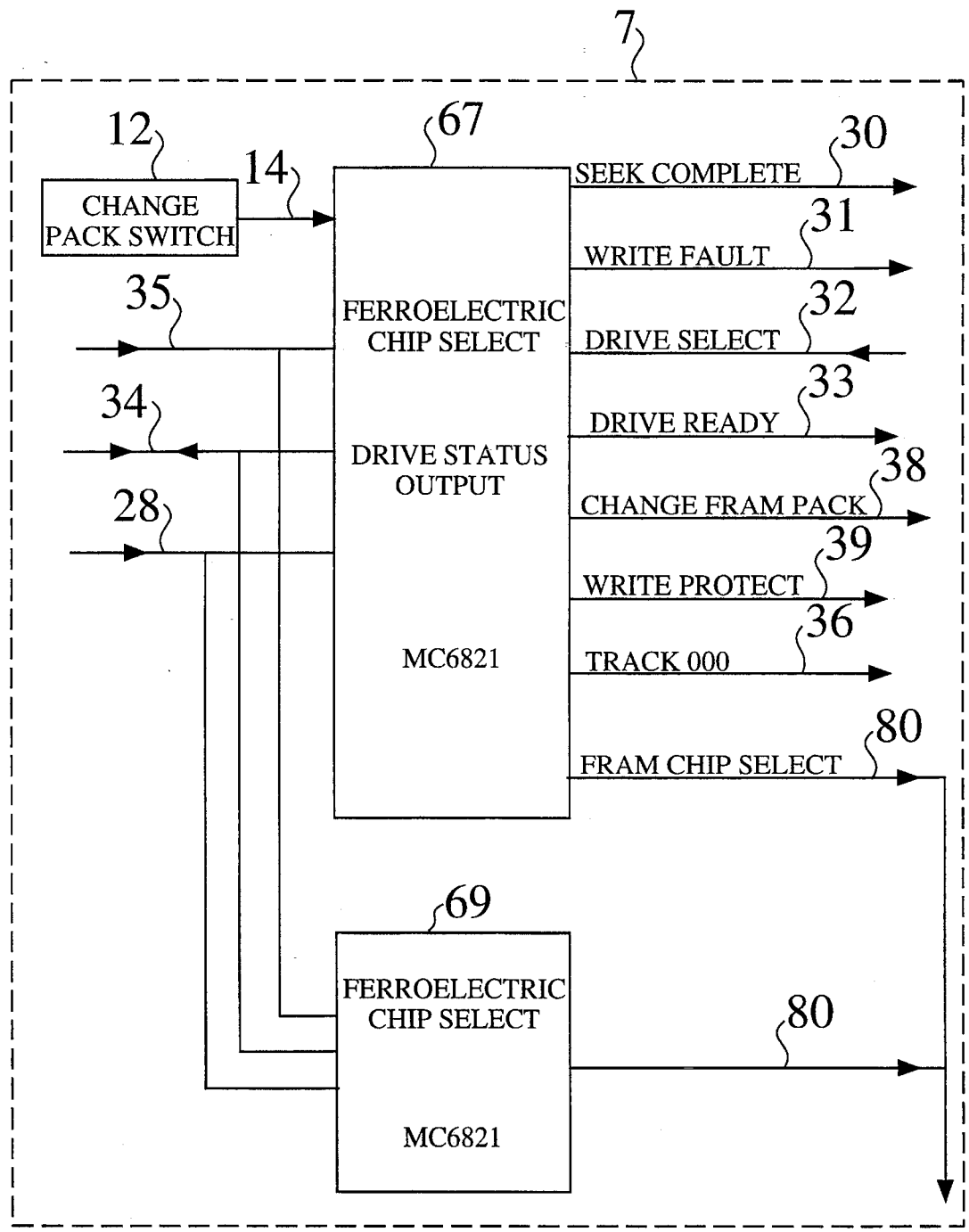
FIG. 4 is a schematic diagram of the Write Protect Switch, Change Pack Switch, System Drive Status, and Chip Select circuit shown in the Ferroelectric Chip Select and Status Control Block Diagram in FIG. 1.
Figure 5:
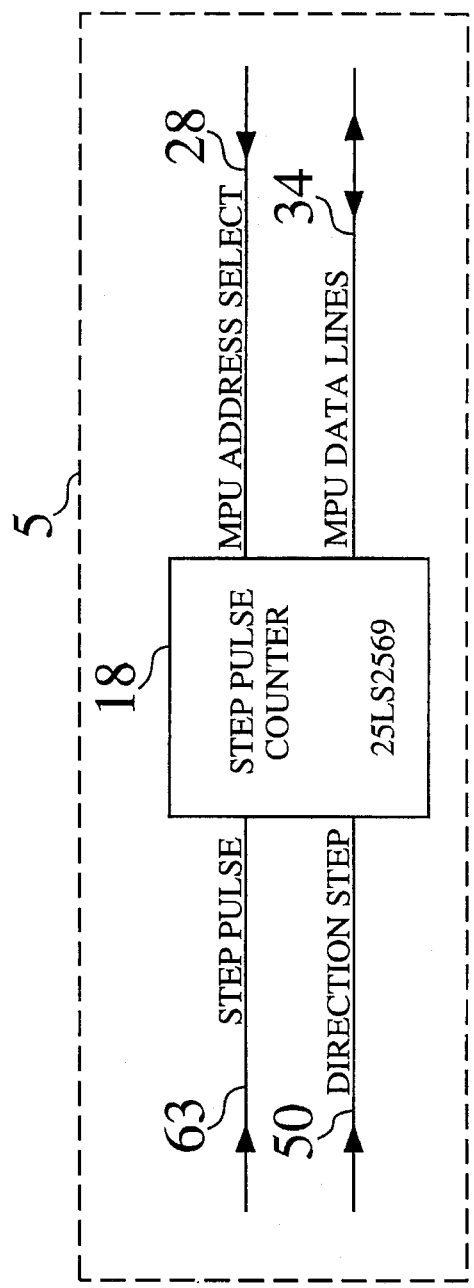
FIG. 5 is a schematic diagram of the Step Pulse Counter circuit shown in the Ferroelectric Status Control Block Diagram in FIG. 1.
Figure 6:
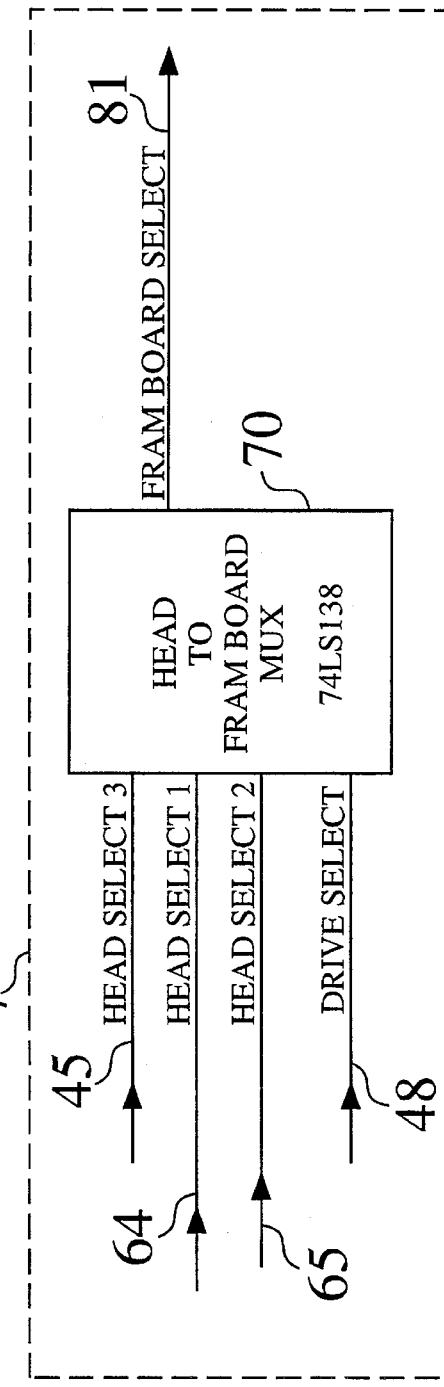
FIG. 6 is a schematic diagram of the Head to Mux circuit shown in the Ferroelectric Chip Select and Status Control Block Diagram in FIG. 1.
Figure 7:
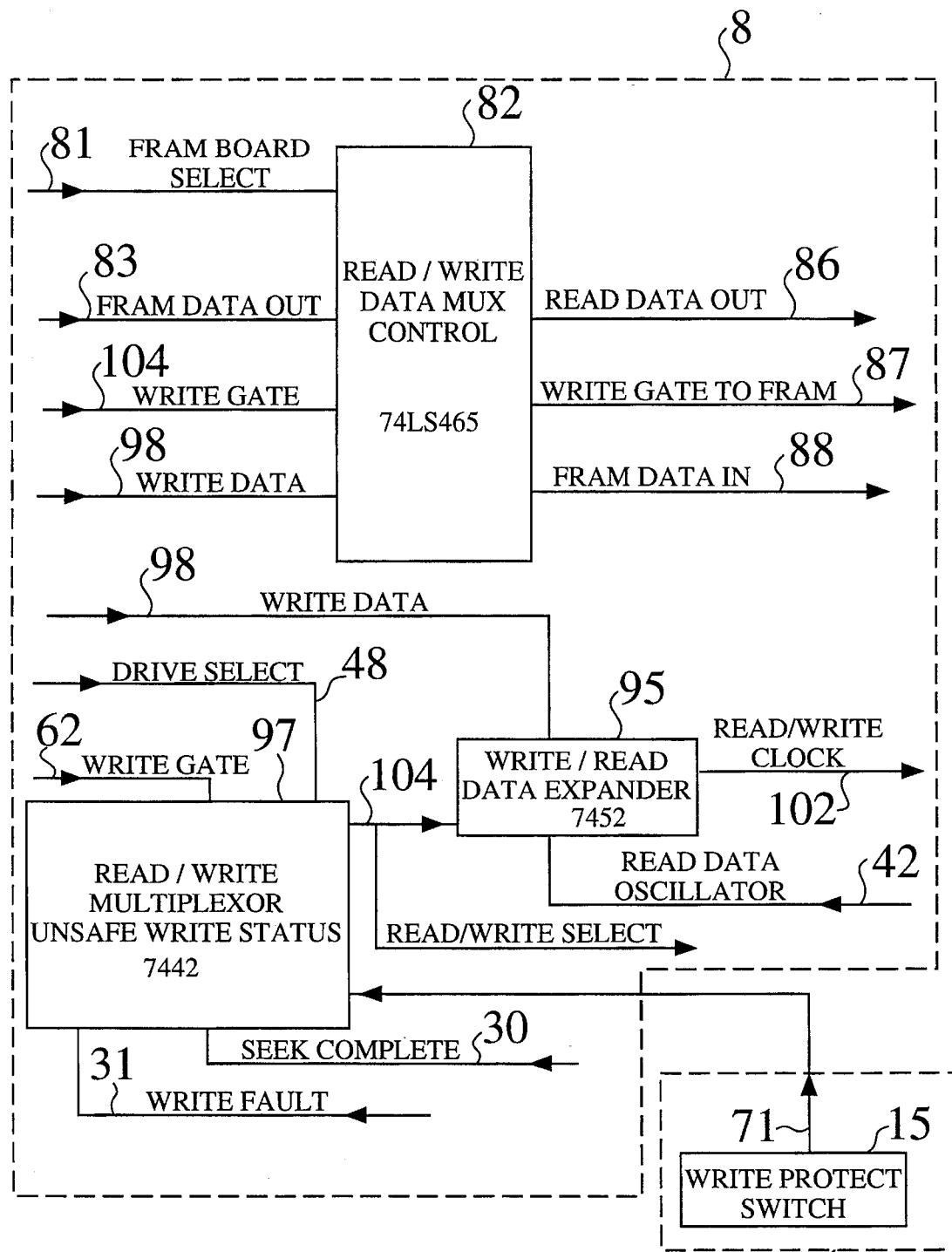
FIG. 7 is a schematic diagram of the Read/Write Data Mux Control, Read/Write Multiplexor and Unsafe Write Status, and Write/Read Data Expander circuit shown in the Ferroelectric Read Write Control Block Diagram in FIG. 1.
Figure 8:
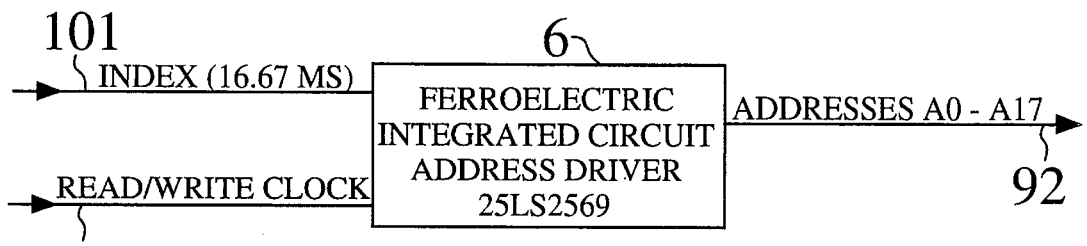
FIG. 8 is a schematic diagram of the Ferroelectric Integrated Circuit Address Driver shown in FIG. 1.
Figure 9:
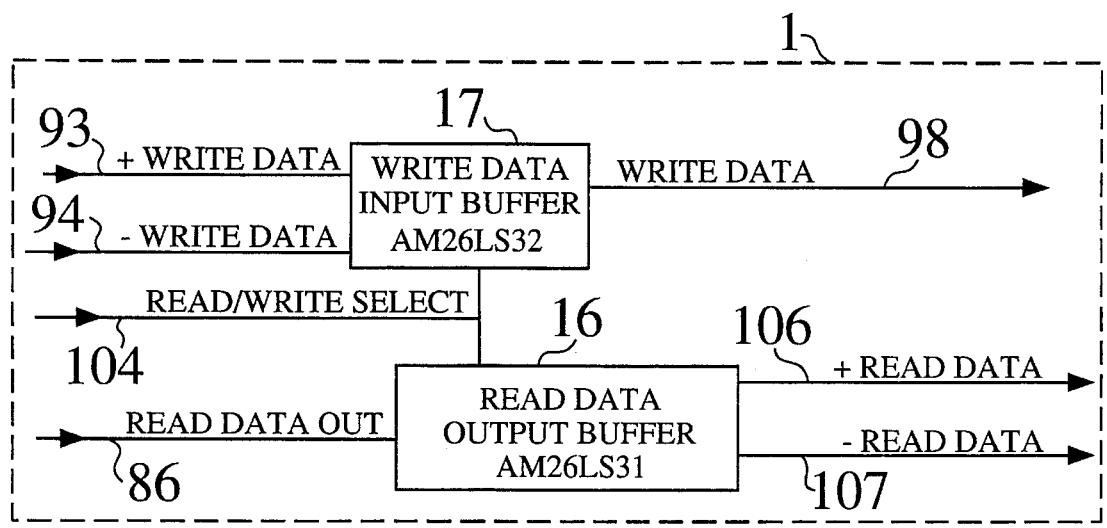
FIG. 9 is a schematic diagram of the Write Data Input Buffer and Read Data Output Buffer circuit shown in the Input Output Buffer Block Diagram in FIG. 1.
Figure 10:
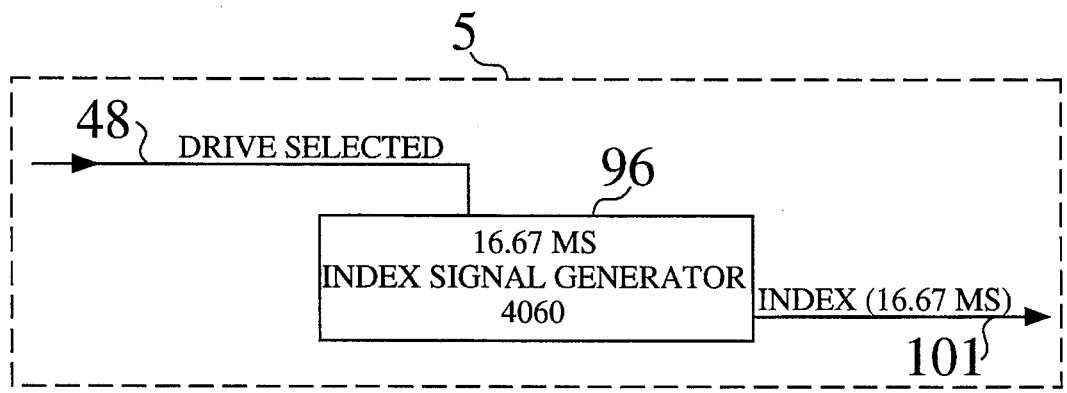
FIG. 10 is a schematic diagram of the Index Generator circuit shown in the Ferroelectric Status Control Block Diagram in FIG. 1.
Figure 11:
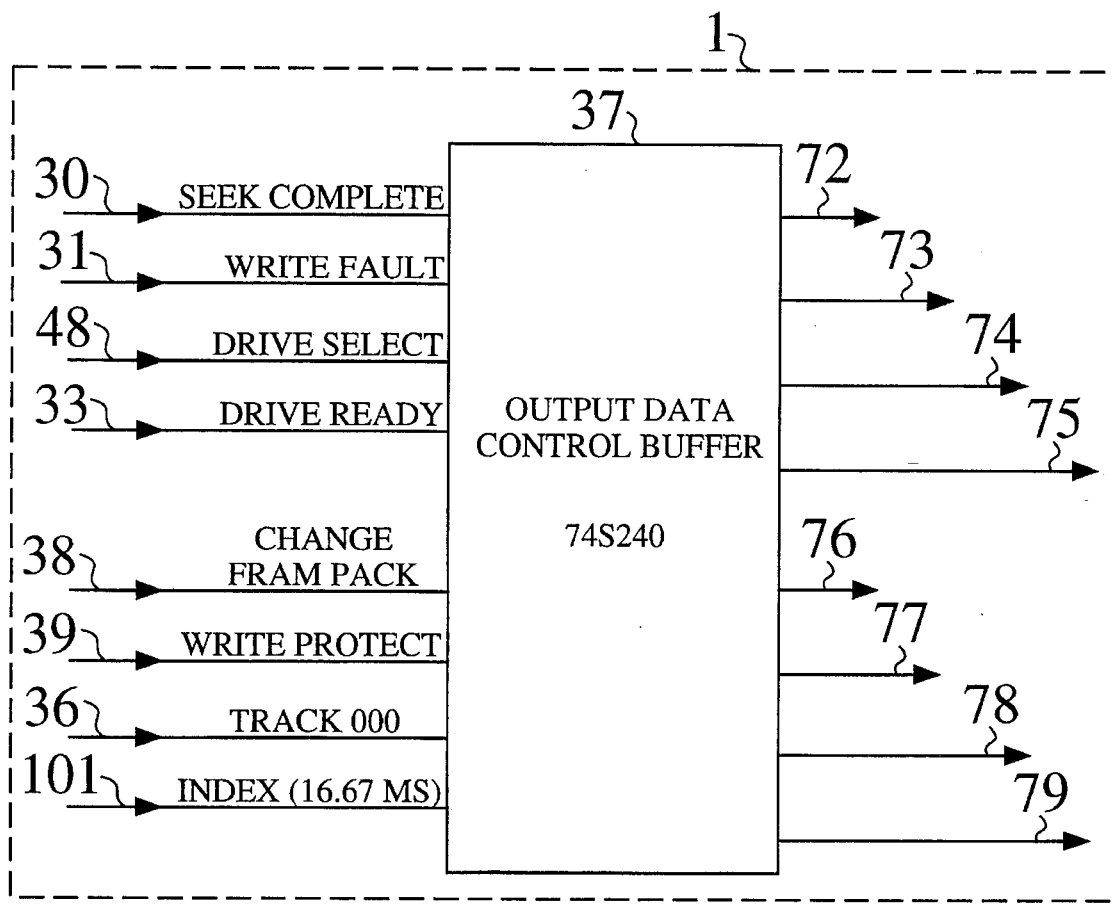
FIG. 11 is a schematic diagram of the Output Data Control Buffer circuit shown in the Input Output Buffer Block Diagram in FIG. 1.
Figure 12:
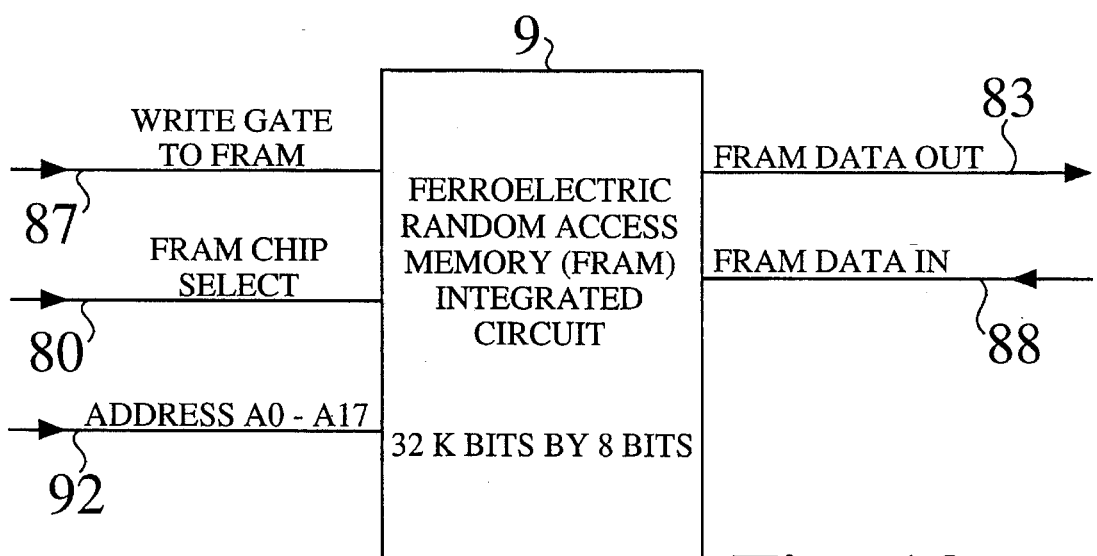
FIG. 12 is a Block Diagram of a Ferroelectric Non-Volatile Integrated Circuit shown in FIG. 1.

FIG. 1 is an overall block diagram of a presently preferred exemplary embodiment of a removable FRAM Pack Winchester drive in accordance with the present invention. FIG. 2 includes Microprocessor 2, System Program Read only Memory 3, System Program Read/Write Memory 4, and System Clock Data Oscillator 44. FIG. 3 includes Manual Select Switch 10, Drive Selector Comparator 11, and Input Data Control Buffer 66. FIG. 4 includes Change Pack Switch 12, Ferroelectric Chip Select/Drive Status output 67, and Ferroelectric Chip Select 69. FIG. 5 includes Step Pulse Counter 18. FIG. 6 includes Head to Board Mux 70. FIG. 7 includes Read/Write Data Mux Control 82, Write/Read Data Expander 95, Read/Write Multiplexor/unsafe Write Status 97, and Write Protect Sensor 15. FIG. 8 includes Ferroelectric Integrated Circuit Address Driver 6. FIG. 9 includes Write Data Input Buffer 17 and Read Data Output Buffer 16. FIG. 10 includes 16.67 millisecond (MS) Index Signal Generator 96. FIG. 11 includes Output Data Control Buffer 37. FIG. 12 includes Ferroelectric Non-Volatile Integrated Circuit 9.

The signal 48 (FIG. 3) from Drive Selector Comparator 11 is a drive select command indicative of a signal 61 from Input Data Control Buffer 66. When signal 61 matches the setting in Manual Select Switch 10 signal 47, the signal 48 is also produced by Drive Selector Comparator 11, and goes to a low logic level to enable further action by the drive Head to Board Mux 70 (FIG. 6), Read/Write Multiplexor Unsafe Write Status 97 (FIG. 7), 16.67 ms Index Signal Generator 96 (FIG. 10), Output Data Control Buffer 37 (FIG. 11), and Ferroelectric Chip Select/Drive Status 67 (FIG. 4). The signals head select 64,65,45, direction 50, write gate 62, step pulse 63 (FIG. 3), +write data 93 (FIG. 9), and −write data 94 (FIG. 9) will all then be connected through internal circuit connections which couple lines 58 to 64, 59 to 65, 60 to 45, 55 to 50, 56 to 62, 57 to 63, 93 to 98, and 94 to 98 through actions of the micro processing unit (MPU) 2, System Decoder 19, and Input Data Control Buffer 66.

The microcomputer 2 will now be discussed in conjunction with FIG. 2. The microprocessor system 2 includes various items which are now commercial items and which are interconnected in a well-known manner. For example, the MC6800 series of microprocessor components, manufactured by Motorola, Inc., of Schaumburg, Ill., is designed to be easily interfaced with common data and address busses and controlled through commonly used control functions. The microprocessor (MPU) 2 has a purpose of logically controlling system functions through the use of Read Only Memory (ROM) 3 firmware programs and Random Access Memory (RAM) 4 temporary storage memory, using microprocessor instruction codes. MPU 2 generates seek, incomplete, drive ready, and write fault signals for Output Data Control Buffer 37 (FIG. 11) and calculates the desired FRAM integrated circuit 9 (FIGS. 1, 12) to read data from or write data to. ROM 3 holds instructions for the system start-up, arithmetic instructions for Chip Select, and drive status data to Input Output Buffer. RAM 4 is used for the temporary storage of FRAM drive system status and control.

Change Pack Switch 12 (FIG. 4) detects whether a pack is in place. Drive Selector Comparator 11 (FIG. 3) compares the Manual Select Switch 10 signal 47 and Input Data Control Buffer 66 signal 61 and produces signal 48 (FIGS. 3,6) drive select which is output to Head to Board Mux 70 (FIG. 6), Read/Write Multiplexor 97 (FIG. 7), 16.67 MS Index Signal Generator 96 (FIG. 10), and 35 Ferroelectric Chip Select 67 (FIG. 4). Drive Selector 11 signal 48 enables the Index Pulse Generator 96 (FIG. 10) to produce an index pulse output signal 101 (FIGS. 8,10) every 16.67 milliseconds to Output Data Control Buffer 37 (FIG. 11) and Ferroelectric Integrated Circuit Address Driver 6 (FIGS. 1,8). Step Pulse Counter 18 signal 63 (FIG. 5) is a step pulse input from Input Data Control Buffer 66 (FIG. 3) signal 63 and is used to toggle the counter up/down. Input Data Control Buffer 66 signal 50 input to Step Pulse Counter 18 signal 50 tells the up/down counter in Step Pulse Counter 18 to count up or to count down. Step Pulse Counter 18 signal 34 is read by the MPU 2 (FIG. 2) signal 34 and represents 12 binary inputs of mathematical weight represented by their placement. MPU 2 reads from ROM 3 to retrieve an add/subtract software routine to calculate a desired 256 k memory block, in order to select the 256 k memory block of the desired position, by selecting the 256 k memory block from its present known position. The desired position will be an absolute count calculated from Step Pulse Counter 18 signal 34.

System Clock Data Oscillator 44 (FIG. 2) signal 42 is used by Ferroelectric Integrated Circuit Address Driver 6 (FIG. 8) signal 92 to generate strobing addresses A0–A17 for FRAM 9 read data.

Ferroelectric Integrated Circuit Address Driver 6 signal 92 output is a 5 MHz oscillator incremental address counter necessary to create data cell times for data from the FRAM 9 (FIG. 12). MPU 2 signal 34 sends a state table Ferroelectric Chip Select Drive Status Output 67,69 (FIG. 4) where the state table data is decoded and output to Write Protect Signal 39, Drive Ready signal 33, Track 000 signal 36, Seek Complete signal 30, Chip Select signal 80, Write Fault signal 31, Change FRAM Pack 38, and Write Protect signal 39. Head to FRAM Board Multiplexor Mux 70 signal 81 (FIG. 6) enables Read/Write Data Mux Control 82 (FIG. 7), which enables the selected FRAM board to read and write data to FRAM 9. System Decoder 19 signal 28 is used for memory mapping the hardware addresses of the microprocessor system to control the Drive. Write Protect Sensor 15 signal 71 (FIG. 7) is logic level low to the Read/Write Multiplexor Unsafe Write Status 97 and prevents any writing to any FRAM integrated circuit 9 if the sensor has been activated. Ferroelectric Chip Select Drive Status Output 67 signals 30,31 (FIG. 7) when in a logic high allow setting Read/Write Multiplexor Unsafe Write Status 97 signal 104 (FIG. 7) for logic high read or a logic low for write. System Ram 4 is used to store system address data, system status, drive status, and error conditions. Data to the drive can be written when the Read/Write Data Mux Control 82 (FIG. 7) signal 87 is logic low and signal 88 has serial data present. Data to the drive can be read when the Read/Write Data Mux Control 82 signal 88 is logic high. When the read/write board is set at the desired electronic selection, Read/Write Data Mux Control 82 is used by the drive to read/write prerecorded frequency pattern placed on the removable FRAM Pack integrated circuits. The Head to FRAM Board Mux 70 (FIG. 6) signal 81 selects the board with which it will read/write, Read/Write Data Mux Control 82 (FIG. 7) signals 88, 87, 83 allow data to transfer, Write Data Input Buffer 17 (FIG. 9) signal 98 allows write data to FRAM 9 and Read Data Output Buffer 16 signal 86 allows read data from FRAM 9. The recorded data passes through Write Data Input Buffer 17 signals 93, 94 and Read Data Output Buffer 16 signals 106, 107 and is thereby sent out on the ST506/SASI/ESDI/SCSI bus to the Winchester controller PCB, i.e. ESDI (Enhanced Small Disk Interface), SMD (Small Memory Device), SASI (Shugart Associates Standard Interface) and SCSI (Small Computer Systems Interface) type signals for conversion and interpretation at the Winchester controller.

Thus, this system which has been described above allows use of the removable FRAM pack to replace a Winchester drive, and allows it to interface in place of a Winchester drive with the ST506/SMD/SASI/ESDI/SCSI standard interface.

The removable FRAM pack drive used with this system is formatted for, typically, 384 and up tracks per inch (TPI) yielding 16,262 bits per inch and up when used. The ferroelectric non-volatile memory IC shall consist of one IC having 262,144 individual memory addresses, with each capable of saving (write) or retrieving (read) one binary weighted bit. The drive's printed circuit boards ("PCBs") shall consist of 20 ferroelectric ICs with each of the ferroelectric non-volatile IC's being able to store 15 tracks of serial data and where 262,144 times 20 ICs=5,242,880 binary bits of information stored on a PCB. Each PCB shall be the equivalent of one Winchester disk drive head, which will achieve a maximum unformatted data interchange of 40 megabytes for each 8 PCB drives. As technology increases and densities of equipment get higher, larger storage, ferroelectric non-volatile integrated circuits will be used to increase drive capacity.

The FRAM pack drive is a removable FRAM pack direct access storage device for receiving and transmitting digital information between computer and system components. The device includes two parts: FRAM and printed circuit board. The FRAM unit is comprised of a film layer of ferroelectric material made of lead zirconate titanate laid underneath a silicon etched substrate consisting of thousands of npn and pnp nodes joined together in tandem, allowing current amplification, and thereby causing the underlying electro/capacitive film to act as a nonlinear capacitor of positive and negative voltage aligning themselves in the direction of current flow. A voltage polarity in a positive or negative orientation will close or create a low resistance to current in its associated npn or pnp junction and a negative/positive polarity will open or create an opposite high resistance to current. The gain of the associated circuitry will thus be effected, creating a high (+5 v) or low (ground) level at the data input/output pin of the device. A printed circuit board is constructed of epoxy/fiberglass used for holding the FRAM IC and associated logic.

Figure 13:
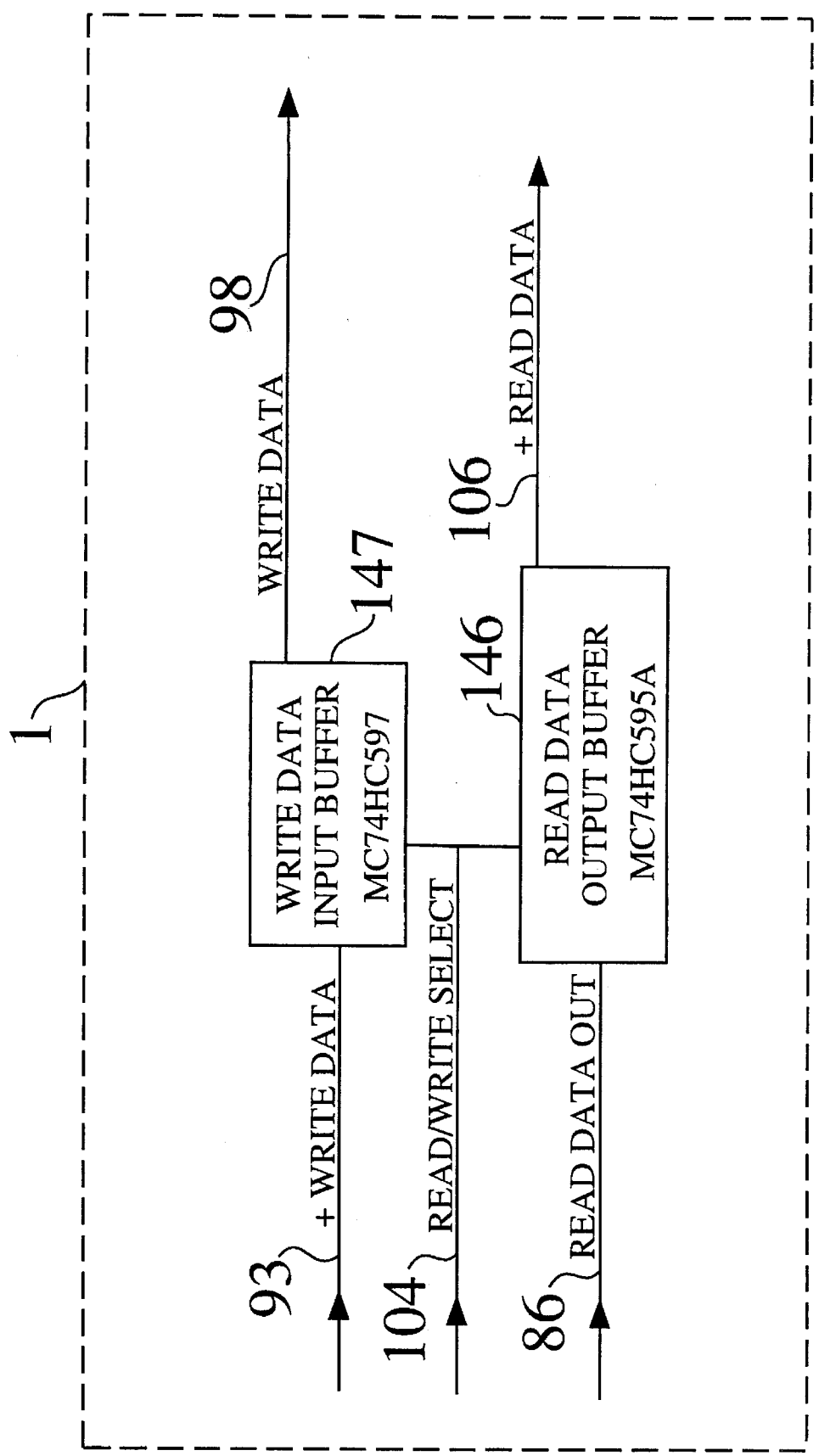
FIG. 13 is a schematic diagram of an alternative embodiment of the Write Data Input Buffer and Read Data Output Buffer circuit shown in the Input Output Buffer Block Diagram in FIG. 1 having a parallel data interface.

FIG. 13 is a schematic diagram of an alternative embodiment of the Write Data Input Buffer and Read Data Output Buffer circuit shown in the Input Output Buffer Block Diagram in FIG. 1 having a parallel data interface. FIG. 13 includes Write Data Input Buffer 147, Read Data Output Buffer 146, 8 bit parallel data port 106, and 8 bit parallel data port 93. With regard to FIG. 7 discussed above, for this embodiment of the invention the signals head select 64, 65, 45, direction 50, write gate 62, step pulse 63, +write data 93 of 8 bits parallel data, +read data of 8 bits parallel data will all then be connected through internal circuit connections which couple lines 58 to 64, 59 to 65, 60 to 45, 55 to 50, 56 to 62, 57 to 63, 94 to 98, and 86 to 106, through actions of the microprocessor MPU 2, System Decoder 19, and Input Data Control Buffer 66. The recorded data passes through Write Data Input Buffer 147 signals 93 to buffer 147 signal 98, and Read Data Output Buffer 146 signals 86 to buffer 147 signal 106 and are thereby sent out on the ST506/SASI/ESDI/SCSI bus to the Winchester controller PCB.

Figure 14:
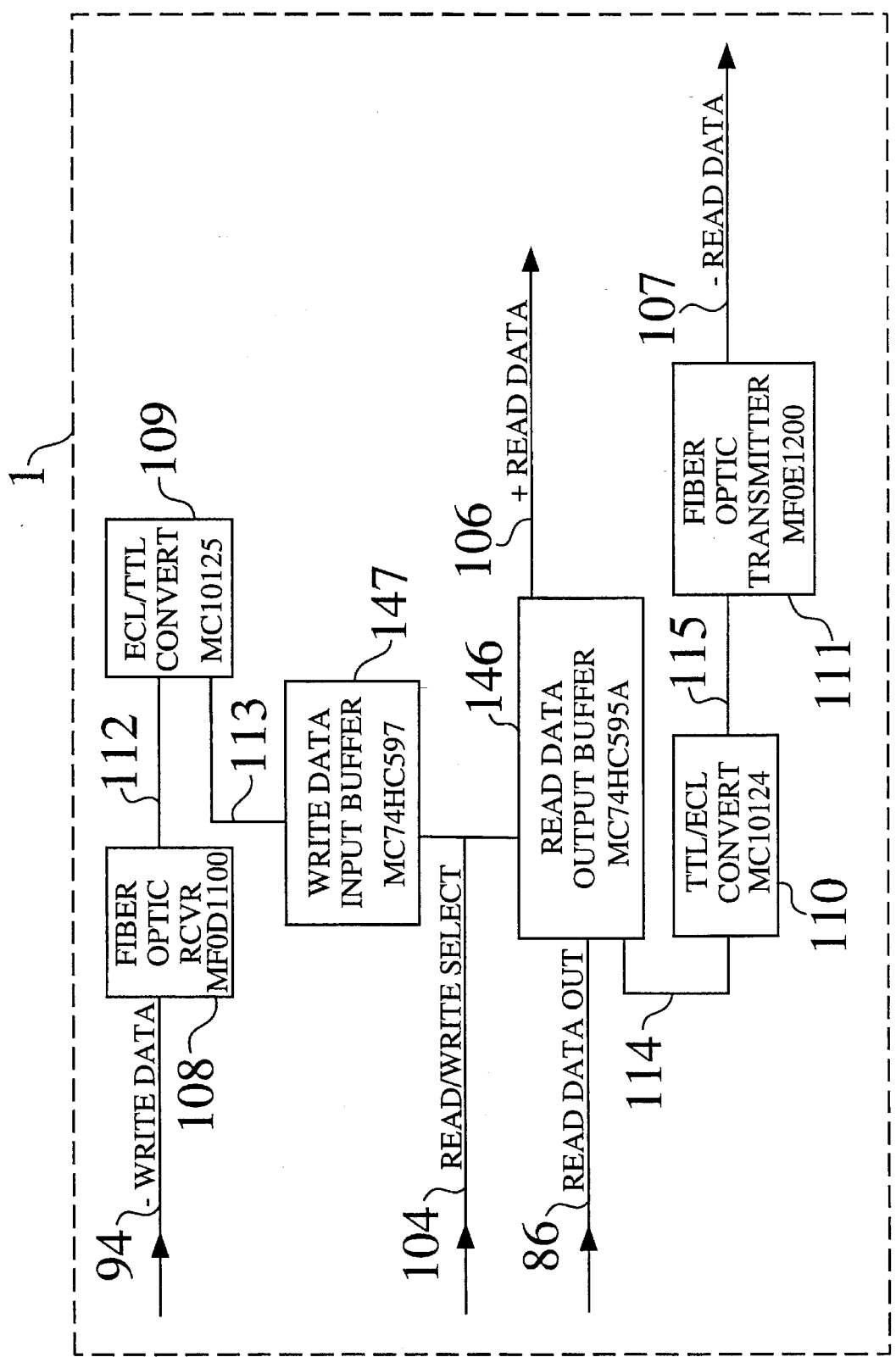
FIG. 14 is a schematic diagram of an alternative embodiment of the Write Data Input Buffer and Read Data Output Buffer circuit shown in the Input Output Buffer Block Diagram in FIG. 1 having an optical data interface.

FIG. 14 is a schematic diagram of an alternative embodiment of the Write Data Input Buffer and Read Data Output Buffer circuit shown in the Input Output Buffer Block Diagram in FIG. 1 having an optical data interface. FIG. 14 includes Write Data Input Buffer 147, Read Data Output Buffer 146, Fiber Optic Receiver 108, ECL/TTL Translator 109, TTL/ECL Translator 110, and Fiber Optic Transmitter 111. With regard to FIG. 7 discussed above, for this embodiment of the invention the signals head select 64,65,45, direction 50, write gate 62, step pulse 63, −write data 94, and −read data 107 will all then be connected through internal circuit connections which couple lines 58 to 64, 59 to 65, 60 to 45, 55 to 50, 56 to 62, 57 to 63, 94 to 112, 112 to 113, 113 to 98, 86 to 114, 114 to 115, and 115 to 107 through actions of the microprocessor MPU 2, System Decoder 19, and Input Data Control Buffer 66. The recorded data passes through Write Data Input Buffer 147 signals 93, 94 signal input to fiber optic light receiver 108 to the ECL/TTL 109 to buffer 147 signal 98, and Read Data Output Buffer 146 signals 106, 114 signal input to the TTL/ECL 110 to the fiber optic light transmitter 111 and are thereby sent out on the ST506/SASI/ESDI/SCSI bus to the Winchester controller PCB.

Figure 15:
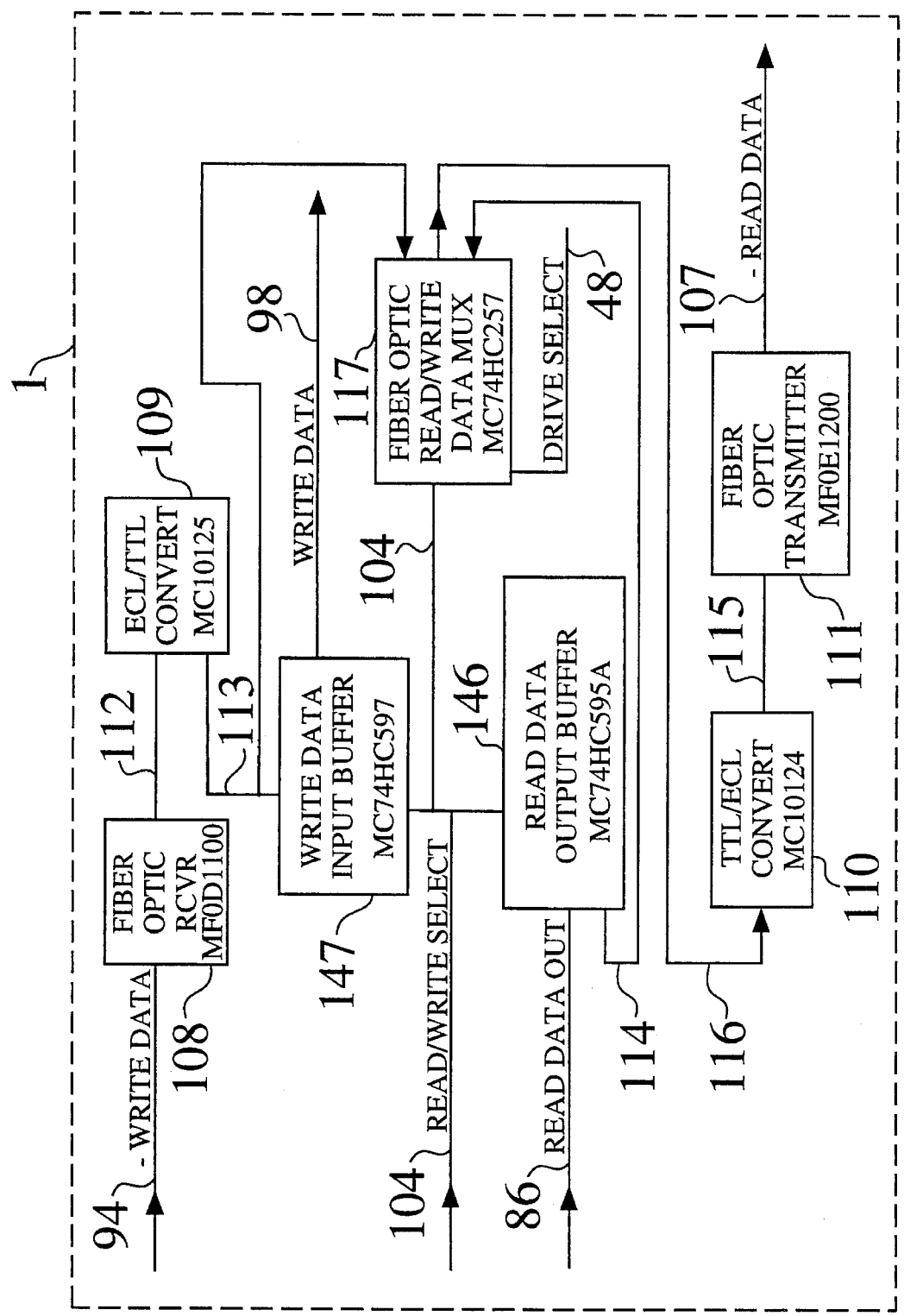
FIG. 15 is a schematic diagram of an alternative embodiment of the Write Data Input Buffer and Read Data Output Buffer circuit shown in the Input Output Buffer Block Diagram in FIG. 1 having a multiplexed optical data interface.

FIG. 15 is a schematic diagram of an alternative embodiment of the Write Data Input Buffer and Read Data Output Buffer circuit shown in the Input Output Buffer Block Diagram in FIG. 1 having a multiplexed optical data interface. FIG. 15 includes Write Data Input Buffer 147, Read Data Output Buffer 146, Fiber Optic Receiver 108, ECL/TTL Translator 109, TTL/ECL Translator 110, Fiber Optic Transmitter 111, and Fiber optic Read/Write data multiplexor 117. With regard to FIG. 7 discussed above, for this embodiment of the invention the signals head select 64,65, 45, direction 50, write gate 62, step pulse 63, −write data 94, and −read data 107 will all then be connected through internal circuit connections which couple lines 58 to 64, 59 to 65, 60 to 45, 55 to 50, 56 to 62, 57 to 63, 94 to 112, 112 to 113, 113 to 98, 86 to 114, 114 to 115, and 115 to 107 through actions of the microprocessor MPU 2, System Decoder 19, and Input Data Control Buffer 66. The recorded data passes through Write Data Input Buffer 147 signals 93, 94 signal input to fiber optic light receiver 108 to the ECL/TTL 109 to buffer 147 signal 98, signal 113 goes to fiber optic Read/Write data multiplexor 117 and if drive signal is active the signal on 113 or 114 will be passed depending on the Read/Write select signal 104, if the drive select signal 48 is inactive (not true) signal 113 will be passed through to signal 116 TTL/ECL converter 110 out to signal 107, and Read Data Output Buffer 146 signals 106, 114 signal input to the TTL/ECL 110 to the fiber optic light transmitter 111 and are thereby sent out on the ST506/SASI/ESDI/SCSI bus to the Winchester controller PCB.

Figure 16:
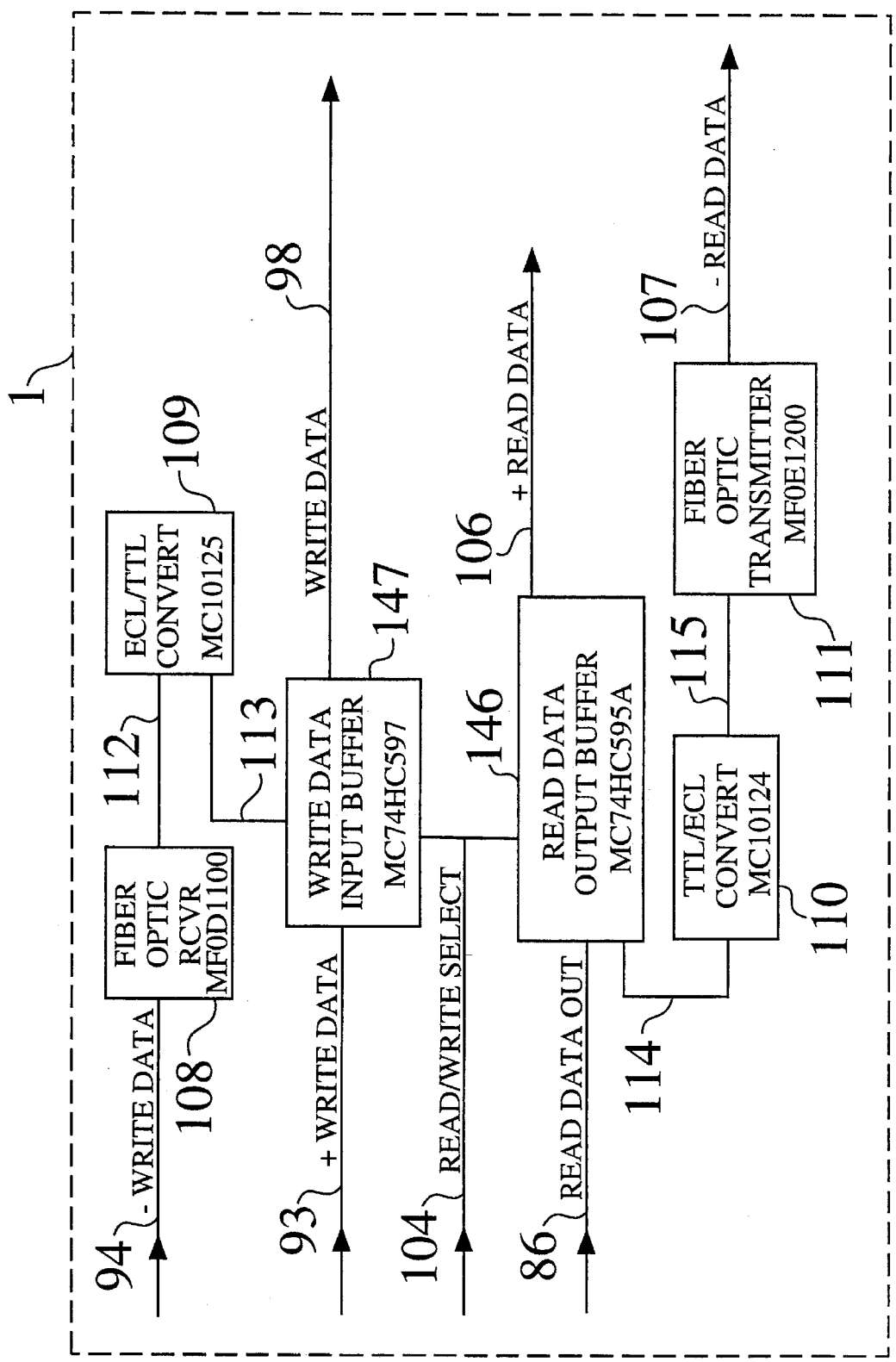
FIG. 16 is a schematic diagram of an alternative embodiment of the Write Data Input Buffer and Read Data Output Buffer circuit shown in the Input Output Buffer Block Diagram in FIG. 1 having an optical and parallel data interface.

FIG. 16 is a schematic diagram of an alternative embodiment of the Write Data Input Buffer and Read Data Output Buffer circuit shown in the Input Output Buffer Block Diagram in FIG. 1 having an optical and parallel data interface. FIG. 16 includes Write Data Input Buffer 147, Read Data Output Buffer 146, Fiber Optic Receiver 108, ECL/TTL Translator 109, 8 bit parallel data port 93, TTL/ECL Translator 110, Fiber Optic Transmitter 111, and 8 bit parallel data port 106. With regard to FIG. 7 discussed above, for this embodiment of the invention the signals head select 64,65,45, direction 50, write gate 62, step pulse 63, +write data 93, −write data 94, +read data 106, and −read data 107 will all then be connected through internal circuit connections which couple lines 58 to 64, 59 to 65, 60 to 45, 55 to 50, 56 to 62, 57 to 63, 93 to 98, 94 to 98, 86 to 106, and 86 to 107 through actions of the microprocessor MPU 2, System Decoder 19, and Input Data Control Buffer 66.

The recorded data passes through Write Data Input Buffer 147 signals 93, 94 signal input to fiber optic light receiver 108 to the ECL/TTL 109 to buffer 147 signal 98, and Read Data Output Buffer 146 signals 106, 114 signal input to the TTL/ECL 110 to the fiber optic light transmitter 111 signal 107 and are thereby sent out on the ST506/SASI/ESDI/SCSI bus to the Winchester controller PCB.

Figure 17:
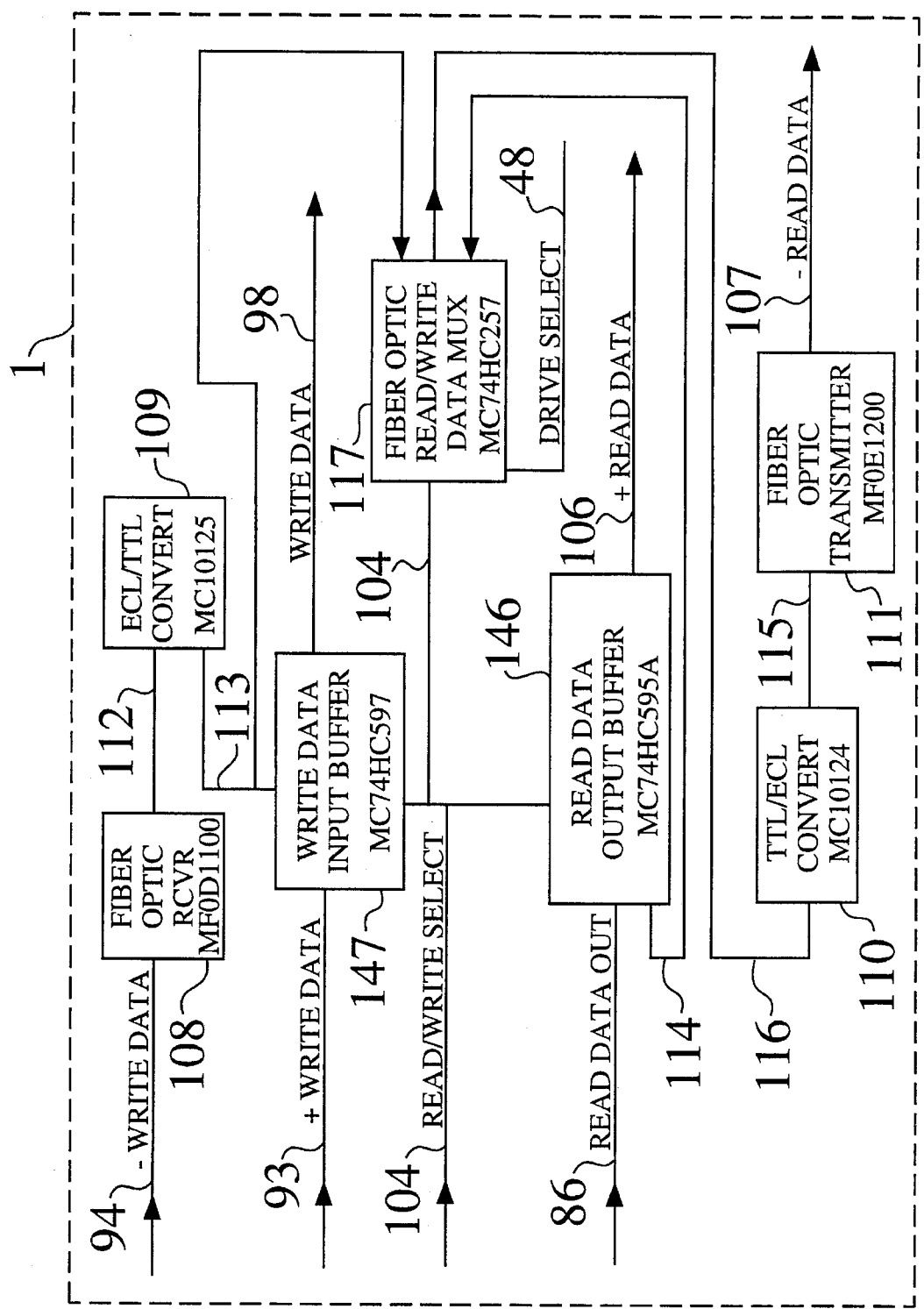
FIG. 17 is a schematic diagram of an alternative embodiment of the Write Data Input Buffer and Read Data Output Buffer circuit shown in the Input Output Buffer Block Diagram in FIG. 1,,having a multiplexed optical and parallel data interface.

FIG. 17 is a schematic diagram of an alternative embodiment of the Write Data Input Buffer and Read Data Output Buffer circuit shown in the Input Output Buffer Block Diagram in FIG. 1 having a multiplexed optical and parallel data interface. FIG. 17 includes Write Data Input Buffer 147, Read Data Output Buffer 146, Fiber Optic Receiver 108, ECL/TTL Translator 109, 8 bit parallel data port 93, TTL/ECL Translator 110, Fiber Optic Transmitter 111, 8 bit parallel data port 106, and Fiber optic read/write data multiplexor 117. With regard to FIG. 7 discussed above, for this embodiment of the invention the signals head select 64,65,45, direction 50, write gate 62, step pulse 63, +write data 93, −write data 94, +read data 106, and −read data 107 will all then be connected through internal circuit connections which couple lines 58 to 64, 59 to 65, 60 to 45, 55 to 50, 56 to 62, 57 to 63, 93 to 98, 94 to 112, 112 to 113, 113 to 98, 86 to 114, 114 to 115, and 115 to 107 through actions of the microprocessor MPU 2, System Decoder 19, and Input Data Control Buffer 66. The recorded data passes through Write Data Input Buffer 147 signals 93, 94 signal input to fiber optic light receiver 108 to the ECL/TTL 109 to buffer 147 signal 98, signal 113 also goes to fiber optic Read/Write data multiplexor 117 and if the drive signal is active the signal on 113 or 114 will be passed depending on the read/write select signal 104 if the derive select signal 48 is inactive signal 113 will be passed through to signal 116 TTL/ECL converter 110 out to signal 107, and Read Data Output Buffer 146 signals 106, 114 signal input fiber optic Read/Write data multiplexor 117 to the TTL/ECL 110 to the fiber optic light transmitter 111 signal 107 and are thereby sent out on the ST506/SASI/ESDI/SCSI bus to the Winchester controller PCB.

Figure 18:
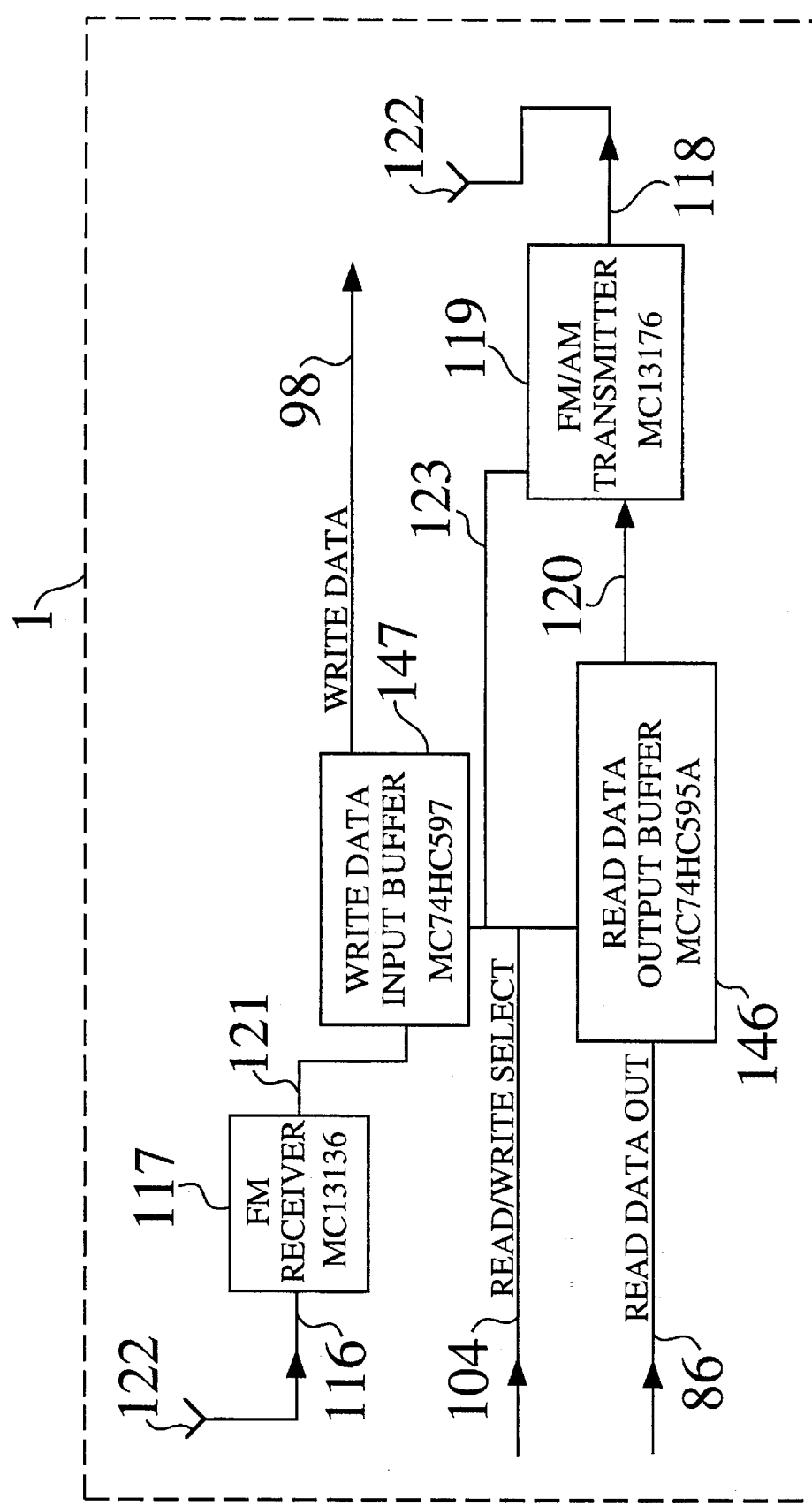
FIG. 18 is a schematic diagram of an alternative embodiment of the Write Data Input Buffer and Read Data Output Buffer circuit shown in the Input Output Buffer Block Diagram in FIG. 1 having a frequency modulated data interface.

FIG. 18 is a schematic diagram of an alternative embodiment of the Write Data Input Buffer and Read Data Output Buffer circuit shown in the Input Output Buffer Block Diagram in FIG. 1 having a frequency modulated data interface. FIG. 18 includes Write Data Input Buffer 147, Read Data Output Buffer 146, RF antennas 122, FM receiver 117, and FM/AM transmitter 119. With regard to FIG. 7 discussed above, for this embodiment of the invention the signals head select 64,65,45, direction 50, write gate 62, step pulse 63, RF write data 116, RF read data 118 will all then be connected through internal circuit connections which couple lines 58 to 64, 59 to 65, 60 to 45, 55 to 50, 56 to 62, 57 to 63, 116 to 98, and 86 to 118 through actions of the microprocessor MPU 2, System Decoder 19, Input Data Control Buffer 66. With regard to FIG. 4 discussed above, for this embodiment of the invention Ferroelectric Chip Select Drive Status Output 67 signals 30,31, when in a logic high, allow setting Read/Write Multiplexor Unsafe Write Status 97 signal 104 for logic high read or a logic low for write. Signal 104 also turns the FM/AM transmitter on/off. The recorded data passes through antenna 122 signal 116 to receiver 117 signal 121 to Write Data Input Buffer 147 signals 98, and Read Data Output Buffer 146 signals 86 to buffer 146 signal 120 transmitter 119 signal 118 to antenna 122 and are thereby sent out on the ST506/SASI/ESDI/SCSI bus to the Winchester controller PCB.

Although only a few presently preferred exemplary embodiments have been discussed in detail above, those of ordinary skill in the art will certainly realize that many modifications are possible without departing from the scope and spirit of the present invention as defined in the following claims.

I claim:

1. A solid-state, non-volatile random access memory (RAM) pack for emulating a rotating disk drive peripheral device in a host data processing system in response to control signals from the host data processing system, the control signals including stepping and stepping direction signals representing movement from a present location to a desired location; the non-volatile random access memory pack using the control signals to address a selected block of solid state memory within the memory pack using a given controller specification including the stepping and stepping direction signals and an indexing control signal, said memory pack comprising:

a removable solid-state non-volatile random access memory means for storing data, said random access memory means comprising a plurality of ferroelectric random access memory integrated circuits, each including a ferroelectric film layer underneath a silicon substrate;

optical data interface means for coupling the random access memory means to said host data processing system, the optical data interface means including:

controller means for receiving control signals used for a disk drive peripheral device;

means for generating from the control signals an address for addressing a section of said random access memory means, said section including a plurality of data storage locations; and means for sequentially addressing said data storage locations within the selected section when reading data from the random access memory to the disk drive controller and when writing data to the random access memory means from the disk drive controller; and from the host data processing system, including means for providing status signals including an index signal to the host data processing system.

2. The apparatus of claim 1, wherein the means for generating includes a microprocessor means for calculating an address from a previous head location and a presently chosen control signal.

3. A solid-state, non-volatile random access memory pack for emulating a rotating disk drive used as a peripheral device in a host data processing system in response to control signals from the host data processing system, the control signals including head select, stepping and stepping direction signals representing movement from a present position to a desired position; said memory pack comprising:

a plurality of non-volatile ferroelectric random access memory (RAM) chips mounted in a predetermined manner on a plurality of printed circuit boards;

optical data interface means for receiving and sending the control signals, and status and data signals between the memory pack and the host data processing system;

microprocessor means storing a previous position and calculating a new position from the head select, stepping and stepping direction signals, the microprocessor means further mapping the new position to a predetermined address for a section of memory in the plurality of ferroelectric RAM chips;

address decoder means for selecting one of said ferroelectric RAM chips and providing a most significant bit address for the section of memory from the predetermined address;

means for generating least significant bit addresses for strobing the section of memory in order to access data stored within the section of memory; and means for multiplexing data signals between a selected one of said ferroelectric RAM chips and the interface means.

4. The apparatus of claim 3, further comprising means for generating status signals provided to the optical data interface means for communication to the host data processing system, the status signals including an index signal.

5. The apparatus of claim 3, further comprising a drive selector, the optical data interface means receiving a drive select signal and comparing it to a preset drive select signal for enabling the RAM memory pack for reading and writing operations.

6. The apparatus of claim 3, wherein the BAM memory pack has a predetermined size for removably inserting into a hole in an enclosure of the host data processing system for a rotating disk drive unit.

7. The apparatus of claim 3, wherein optical read and write data pass through a write data input buffer to a fiber optic light receiver, and a read data output buffer to a fiber optic light transmitter, and are thereby sent out on an ST506/SASI/ESDI/SCSI bus to a RAM memory pack controller.

8. A data processing system comprising:

central processing unit means;

controller means for a peripheral rotating disk drive, the controller means coupled with the central processing unit means;

mounting means for removably receiving a non-volatile non-rotating solid state ferroelectric random access memory (RAM) memory pack, the mounting means coupling the RAM memory pack for communication to the controller means, the RAM memory pack including:

a plurality of non-volatile ferroelectric random access memory (RAM) chips mounted on a plurality of printed circuit boards;

optical data interface means for receiving and sending control, status and data signals between the RAM memory pack and the controller means, the control signals from the controller means including head select, stepping and stepping direction signals representing movement from a present cylinder to a desired cylinder;

microprocessor means for determining from the head select, stepping and stepping direction signals a predetermined address for a section of memory in the plurality of RAM ferroelectric chips;

address decoder means for selecting one of said ferroelectric RAM chips and providing a most significant bit address for the section of memory from predetermined address;

means for generating least significant bit addresses for strobing the section of memory in order to access data stored within the section of memory; and means for multiplexing data signals between a selected one of said ferroelectric RAM chips and the optical data interface means.

9. The apparatus of claim 8, further comprising:

a rotating, magnetic disk drive coupled to the controller means, and a drive select signal for selecting between the memory pack and the magnetic disk drive.

10. The apparatus of claim 8, wherein optical read and write data pass through a write data input buffer to a fiber optic light receiver, and a read data output buffer to a fiber optic light transmitter, and are thereby sent out on an ST506/SASI/ESDI/SCSI bus to a RAM memory pack controller.

11. A method for interfacing a controller for a peripheral rotating disk drive unit for a host data processing system to a solid state, non-volatile ferroelectric random access memory, comprising the steps of:

receiving head select, stepping and stepping direction signals via an optical data interface from the host data processing system representing selection of and seeking by a read/write head from a previous track in a rotating disk drive;

determining a new track from the stored previous track;

mapping the new track to a section of the non-volatile, ferroelectric random access memory (RAM);

enabling access to the section of the non-volatile ferroelectric RAM;

strobing the section of the non-volatile ferroelectric RAM to read data from and write data to the section;

providing status signals to the host data processing system representing a normally operating rotating disk drive, the status signals including an index signal.

12. The method of claim 11, wherein the step of determining the new track includes the step of counting the pulses in the stepping signal in the direction indicated by the direction signal.

13. The method of claim 11, wherein the step of mapping is performed by a microprocessor.

14. The method of claim 11, wherein the step of enabling access to the section of the non-volatile ferroelectric random access memory includes the steps of:

selecting a chip, from a plurality of chips comprising the non-volatile ferroelectric random access memory; and multiplexing read/write command signals and data signals to the plurality of chips comprising the non-volatile ferroelectric random access memory.

15. The method of claim 11, wherein optical read and write data pass through a write data input buffer to a fiber optic light receiver, and a read data output buffer to a fiber optic light transmitter, and are thereby sent out on an ST506/SASI/ESDI/SCSI bus to a RAM memory pack controller.

* * * * *